United States Patent
Chew et al.

(10) Patent No.: US 9,583,449 B2
(45) Date of Patent: Feb. 28, 2017

(54) SEMICONDUCTOR PACKAGE

(71) Applicant: ADVANPACK SOLUTIONS PTE LTD., Singapore (SG)

(72) Inventors: Hwee-Seng Jimmy Chew, Singapore (SG); Kian-Hock Lim, Singapore (SG); Oviso Dominador Fortaleza, Jr., Singapore (SG); Shoa-Siong Raymond Lim, Singapore (SG)

(73) Assignee: ADVANPACK SOLUTIONS PTE LTD., Singapore (SG)

( * ) Notice: Subject to any disclaimer, the term of this patent is extended or adjusted under 35 U.S.C. 154(b) by 0 days.

(21) Appl. No.: 14/961,825

(22) Filed: Dec. 7, 2015

(65) Prior Publication Data
US 2016/0118349 A1  Apr. 28, 2016

Related U.S. Application Data

(62) Division of application No. 14/185,779, filed on Feb. 20, 2014, now Pat. No. 9,219,027, which is a division
(Continued)

(51) Int. Cl.
*H01L 23/12* (2006.01)
*H01L 23/00* (2006.01)
(Continued)

(52) U.S. Cl.
CPC .......... *H01L 23/562* (2013.01); *H01L 23/293* (2013.01); *H01L 23/3114* (2013.01);
(Continued)

(58) Field of Classification Search
CPC . H01L 23/562; H01L 23/293; H01L 23/3114; H01L 23/49582; H01L 24/97
(Continued)

(56) References Cited

U.S. PATENT DOCUMENTS 5,677,576 A    10/1997  Akagawa
5,841,194 A *  11/1998  Tsukamoto ........... H01L 23/145
                                                          257/668
(Continued)

FOREIGN PATENT DOCUMENTS

CN          1516251 A      7/2004

OTHER PUBLICATIONS

Taiwanese Office Action dated Oct. 27, 2015.
Chinese Office Action dated Mar. 2, 2016.

*Primary Examiner* — Nitin Parekh
(74) *Attorney, Agent, or Firm* — Rabin & Berdo, P.C.

(57) ABSTRACT

A semiconductor package includes a dielectric layer, a plurality of traces, a plurality of electrical pads, a plurality of studs and at least a semiconductor device. The dielectric layer has a first dielectric surface and a second dielectric surface opposite the first dielectric surface. The traces are disposed in the dielectric layer and are exposed on the second dielectric surface. The electrical pads are disposed on the first dielectric surface. The studs are disposed in the dielectric layer and are exposed on the first dielectric surface. The studs are electrically connected to the traces and the electrical pads. The semiconductor device is disposed on the second dielectric surface and electrically connected to the traces.

13 Claims, 8 Drawing Sheets

Related U.S. Application Data of application No. 13/222,792, filed on Aug. 31, 2011, now Pat. No. 8,709,874.

(60) Provisional application No. 61/378,447, filed on Aug. 31, 2010.

(51) Int. Cl.
*H01L 23/495* (2006.01)
*H01L 23/498* (2006.01)
*H01L 23/29* (2006.01)
*H01L 23/31* (2006.01)

(52) U.S. Cl.
CPC .... *H01L 23/4952* (2013.01); *H01L 23/49513* (2013.01); *H01L 23/49524* (2013.01); *H01L 23/49541* (2013.01); *H01L 23/49582* (2013.01); *H01L 23/49861* (2013.01); *H01L 24/97* (2013.01); H01L 23/3121 (2013.01); H01L 24/16 (2013.01); H01L 24/32 (2013.01); H01L 24/48 (2013.01); H01L 24/73 (2013.01); H01L 2224/16225 (2013.01); H01L 2224/16227 (2013.01); H01L 2224/16245 (2013.01); H01L 2224/32227 (2013.01); H01L 2224/32245 (2013.01); H01L 2224/48091 (2013.01); H01L 2224/48227 (2013.01); H01L 2224/48247 (2013.01); H01L 2224/73265 (2013.01); H01L 2224/97 (2013.01); H01L 2924/01029 (2013.01); H01L 2924/01033 (2013.01); H01L 2924/01075 (2013.01); H01L 2924/01079 (2013.01); H01L 2924/12042 (2013.01); H01L 2924/15787 (2013.01); H01L 2924/181 (2013.01); Y10T 29/49155 (2015.01)

(58) Field of Classification Search
USPC .................................................. 257/702, 774
See application file for complete search history.

(56) References Cited

U.S. PATENT DOCUMENTS

| | | | |
|---|---|---|---|
| 5,874,784 A | 2/1999 | Aoki et al. | |
| 5,897,337 A | 4/1999 | Kata et al. | |
| 5,952,718 A | 9/1999 | Ohtsuka et al. | |
| 5,976,912 A | 11/1999 | Fukutomi et al. | |
| 6,031,292 A | 2/2000 | Murakami et al. | |
| 6,064,111 A | 5/2000 | Sota et al. | |
| 6,545,351 B1* | 4/2003 | Jamieson | H01L 23/3128 257/668 |
| 6,861,750 B2* | 3/2005 | Zhao | H01L 23/3677 257/666 |
| 7,790,505 B2 | 9/2010 | Lin et al. | |
| 7,915,080 B2 | 3/2011 | Takahashi et al. | |
| 8,159,828 B2 | 4/2012 | Sun et al. | |
| 8,338,232 B2 | 12/2012 | Shi et al. | |
| 2002/0098617 A1* | 7/2002 | Lee | H01L 24/49 438/106 |
| 2002/0171144 A1* | 11/2002 | Zhang | H01L 23/13 257/738 |
| 2002/0180040 A1* | 12/2002 | Camenforte | H01L 23/36 257/738 |
| 2003/0111726 A1* | 6/2003 | Khan | H01L 23/13 257/730 |
| 2006/0094158 A1 | 5/2006 | Lee et al. | |
| 2008/0096321 A1 | 4/2008 | Lin et al. | |
| 2010/0159643 A1 | 6/2010 | Takahashi et al. | |

* cited by examiner

SEMICONDUCTOR PACKAGE

This application is a divisional application of co-pending U.S. patent application Ser. No. 14/185,779, filed Feb. 20, 2014, which is a divisional application of co-pending U.S. patent application Ser. No. 13/222,792, filed Aug. 31, 2011, which claims the benefit of a provisional application Ser. No. 61/378,447, filed Aug. 31, 2010, the subject matters of which are incorporated herein by reference.

BACKGROUND OF THE INVENTION

Field of the Invention

The invention relates in general to a semiconductor package, and more particularly to a semiconductor package having a stud.

Description of the Related Art

A conventional semiconductor package typically includes substrate, semiconductor device and interconnection. The substrate, such as plastic or ceramic substrate, is used for carrying a chip. The substrate, having a first surface and a second surface opposite to the first surface, includes at least a pad and a through-hole. The chip is disposed on the first surface of the substrate. The interconnection connects the semiconductor device to the pad located on the first surface of the substrate. The pad of the substrate is electrically connected to the second surface of the substrate via a through-hole.

Since the through-hole penetrates the substrate, the structural strength of the substrate will be weakened. Hence, the through-hole is separated from one another as well as the edges of the substrate by a large distance so that the structural strength of the substrate is still within an acceptable range. However, such practice will make it difficult to reduce the size of the semiconductor package. Besides, the thickness of the substrate is relatively large and hence makes it difficult to reduce the thickness of the semiconductor package.

SUMMARY OF THE INVENTION

According to a third aspect of the present invention, a semiconductor package is provided. The semiconductor package comprises a dielectric layer, a plurality of traces, a plurality of electrical pads, a plurality of studs and at least a semiconductor device. The dielectric layer has a first dielectric surface and a second dielectric surface opposite the first dielectric surface. The traces are disposed in the dielectric layer and are exposed on the second dielectric surface. The electrical pads are disposed on the first dielectric surface. The studs are disposed in the dielectric layer and are exposed on the first dielectric surface. The studs are electrically connected to the traces and the electrical pads. The semiconductor device is disposed on the second dielectric surface and electrically connected to the traces.

The above and other aspects of the invention will become better understood with regard to the following detailed description of the preferred but non-limiting embodiment (s). The following description is made with reference to the accompanying drawings.

DETAILED DESCRIPTION OF THE INVENTION

Figure 1:
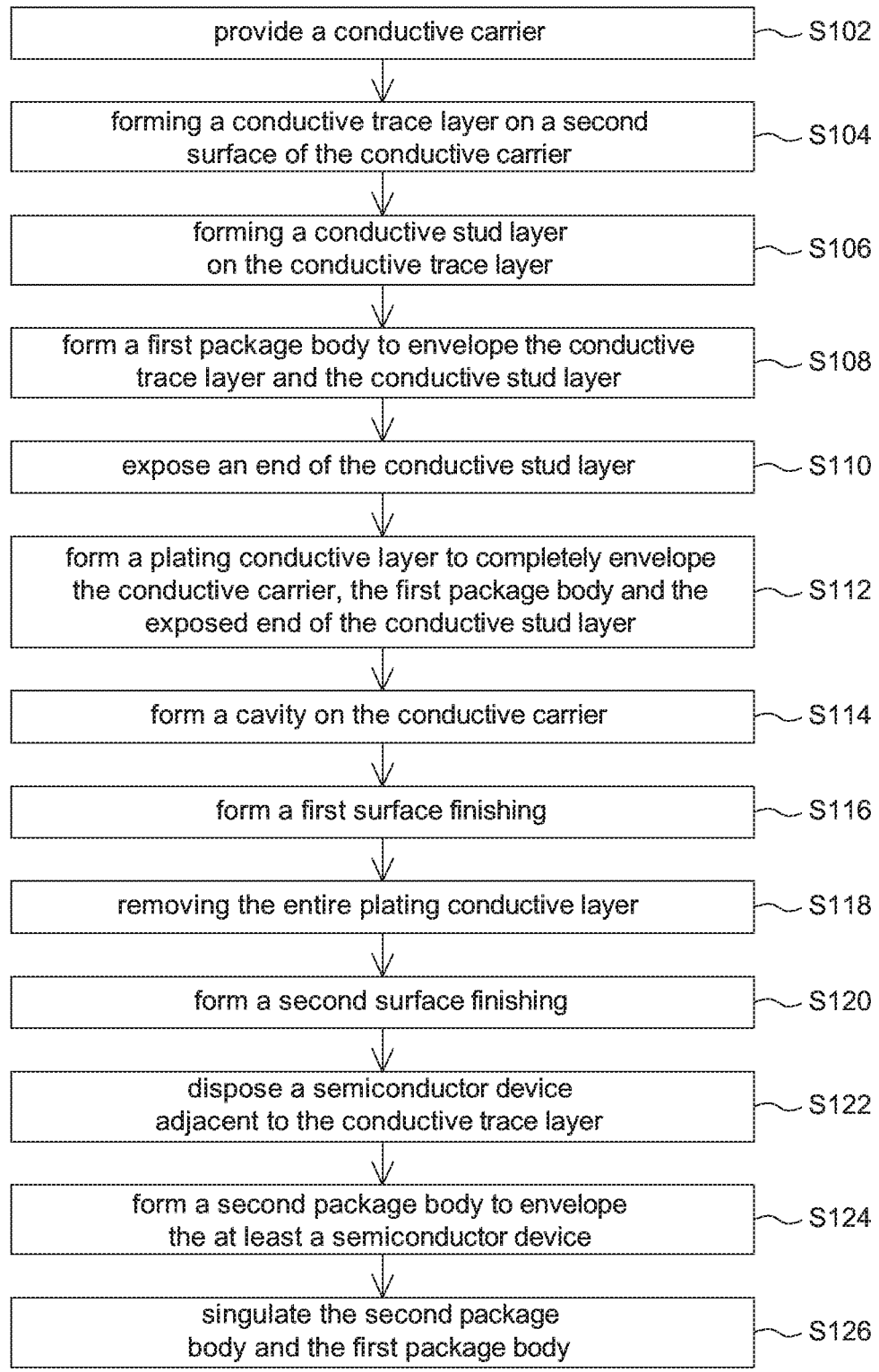
FIG. 1 shows a flowchart of a manufacturing method of a semiconductor package according to an embodiment of the invention.

Referring to FIG. 1 and FIGS. 2A~2J. FIG. 1 shows a flowchart of a manufacturing method of a semiconductor package according to an embodiment of the invention. FIGS. 2A~2J illustrates the processes of manufacturing a semiconductor device carrier according to an embodiment of the invention.

Figure 2A:
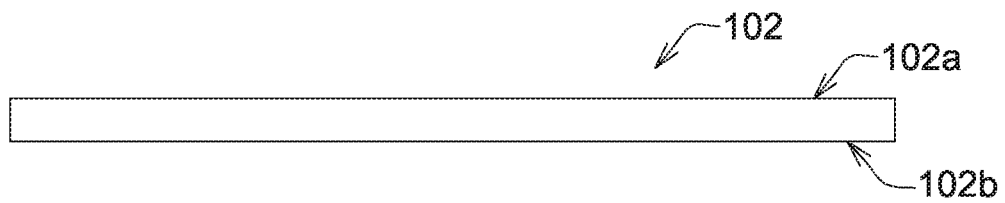
FIGS. 2A~2J shows the processes of manufacturing a semiconductor device carrier according to an embodiment of the invention.

In step S102, referring to FIG. 2A, a conductive carrier 102 having a first surface 102a and a second surface 102b opposite to the first surface 102a is provided, wherein the conductive carrier 102 is preferably formed by a metal plate comprising of copper, iron or steel.

Figure 2B:
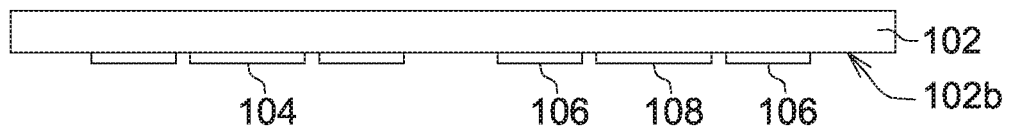

In step S104, referring to FIG. 2B, a conductive trace layer 104 is formed on the second surface 102b of the conductive carrier 102 preferably by means of photolithography and electrolytic plating. The conductive trace layer 104 is patterned to comprise of at least a trace 106 and at least a die pad 108, and preferably formed by metal layers comprising of copper.

Figure 2C:
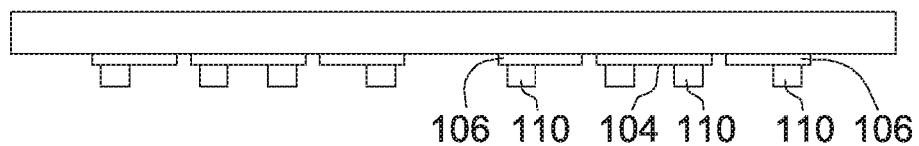

In step S106, referring to FIG. 2C, a conductive stud layer is formed on the conductive trace layer 104 preferably by means of photolithography and electrolytic plating. The conductive stud layer comprises of at least a conductive stud 110 connected to the corresponding trace 106 and die pad 108, and preferably formed by a metal such as copper.

Figure 2D:
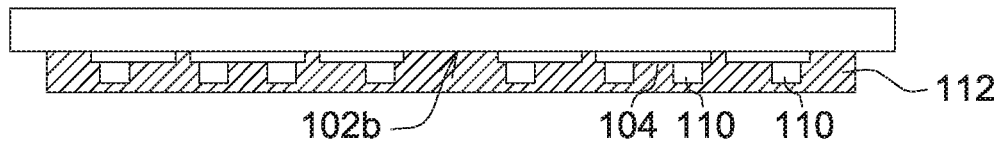

In step S108, referring to FIG. 2D, a first dielectric layer 112 is preferably formed by transfer molding to encapsulate the conductive trace layer 104, the conductive stud layer and the second surface 102b. In the present embodiment of the invention, the first dielectric layer 112 completely encapsulates the conductive trace layer 104 and the conductive stud layer. The first dielectric layer 112 is preferably formed by a material comprising of novolac-based resin, epoxy-based resin, silicone-based resin or other suitable encapsulant. The material is first heated to a molten state to encapsulate the conductive trace layer 104 and the conductive stud layer under a high-temperature and high-pressure environment and thereafter solidifies to form the first dielectric layer 112. Preferably, the first dielectric layer 112 also comprises of a suitable filler material such as powdered silicon dioxide.

Exemplary steps for forming a first dielectric layer 112 are as follows. Firstly, an encapsulant comprising of resin and powdered silicon dioxide is provided and heated to a molten state. Next, the molten encapsulant is infused onto the second surface 102b of the conductive carrier 102 and simultaneously envelops the conductive trace layer 104 and the conductive stud layer (including at least a conductive stud 110) under a high-temperature and high-pressure environment. Thereafter the encapsulant is solidified to form the first dielectric layer 112.

In other implementations, the first dielectric layer 112 can also be formed by injection molding or compression molding.

Preferably, prior to the step of forming the first dielectric layer 112, an adhesion layer (not illustrated) is formed on the surface of the conductive trace layer 104 and the surface of the conductive stud layer to enhance the adhesion between these surfaces and the first dielectric layer 112 and increase the reliability of the product accordingly.

Figure 2E:
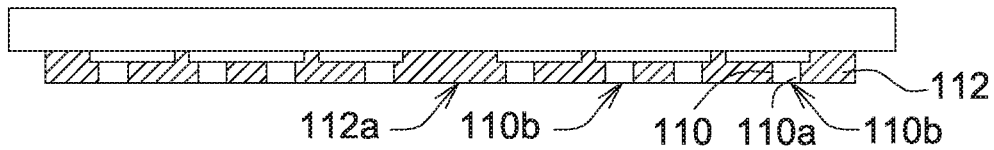

In step S110, referring to FIG. 2E, a partial layer of the first dielectric layer 112 is removed preferably by grinding to expose a base surface 110b of an end 110a of the conductive stud 110. After removal, a first dielectric surface 112a is formed on the first dielectric layer 112, and the base surface 110b is formed on the conductive stud 110. Preferably, the base surface 110b of the conductive stud 110 is substantially aligned with (such as coplanar with) the first dielectric surface 112a. In other implementations, the base surface 110b of the end 110a of the conductive stud 110 is exposed simultaneously when the first dielectric layer 112 is formed, such that subsequent removal of any partial layer of the first dielectric layer 112 is not required.

Figure 2F:
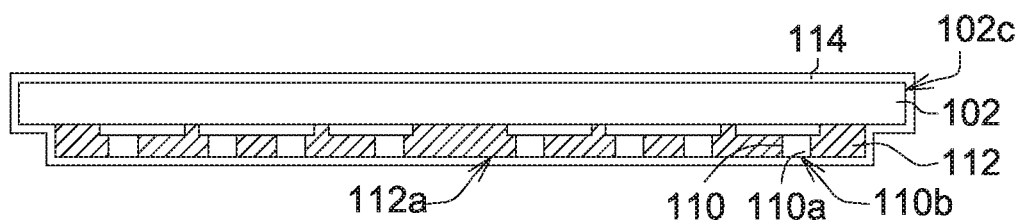

In step S112, referring to FIG. 2F, a plating conductive layer 114 is formed to envelop the conductive carrier 102, the first dielectric layer 112 and the exposed end 110a of the conductive stud 110. Preferably, the plating conductive layer 114 is formed by electroless plating and enveloped the first surface 102a, the lateral side 102c and any exposed second surface 102b of the conductive carrier 102, the first dielectric surface 112a and the lateral side 112b of the first dielectric layer 112, as well as the exposed end 110a of the conductive stud 110. The thickness of the plating conductive layer 114 ranges between 6~10 μm. In addition, the plating conductive layer 114 is preferably formed by a single-layered metal comprising of copper or nickel.

Alternatively, the plating conductive layer 114 can also be formed by multi-layered metals. In another implementation, the formation of the conductive layer 114 comprises of the following steps. Firstly, a seed layer (not illustrated) is formed by electroless plating to envelop the conductive carrier 102, the first dielectric layer 112 and the exposed end 110a of the conductive stud 110. The area encapsulated by the seed layer is similar to that encapsulated by the plating conductive layer 114 as described above. Thereafter a sub-conductive layer is formed over the seed layer by electrolytic plating. Both the seed layer and sub-conductive layer comprises of copper or nickel respectively. Preferably, the thickness of the seed layer ranges between 1~2 μm, and the thickness of the sub-conductive layer ranges between 5~8 μm.

Figure 2G:
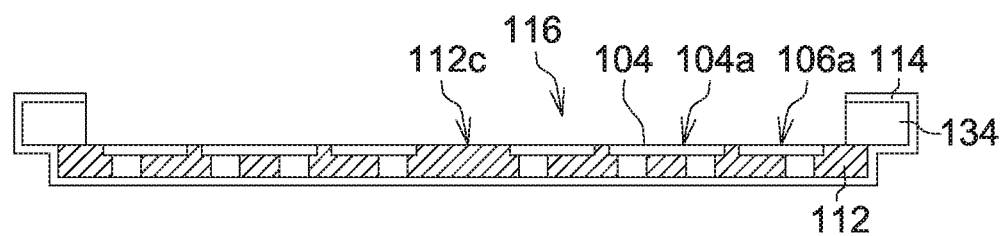

In step S114, referring to FIG. 2G, at least one cavity 116 is formed in the conductive carrier 102 wherein the conductive trace layer 104 and the first dielectric layer 112 are exposed in the cavity 116. Preferably, a portion of the conductive carrier 102 is removed by photolithography and etching to form the cavity 116. Specifically, the trace surface 104a of the conductive trace layer 104 and the second dielectric surface 112c of the first dielectric layer 112 are exposed from the cavity 116, wherein the trace surface 104a and the second dielectric surface 112c are opposite to the first dielectric surface 112a. The die pad 108 has a die pad surface 108a and the trace 106 has a trace surface 106a, wherein the die pad surface 108a and the trace surface 106a define the trace surface 104a. Preferably, when the portion of the conductive carrier 102 is removed by etching, the conductive trace layer 104 further comprises of an etching barrier layer (not illustrated) interposed between the conductive carrier 102 and the conductive trace layer 104. The etching barrier layer comprises of nickel (Ni) or gold (Au).

After a portion of the conductive carrier 102 is removed, the remaining portion of the conductive carrier 102 forms a plating ring 134 around the peripheral of the first dielectric layer 112. The plating ring 134 is electrically connected to the conductive stud 110 and the conductive trace layer 104 via the plating conductive layer 114 on the first dielectric surface 112a.

Figure 2H:
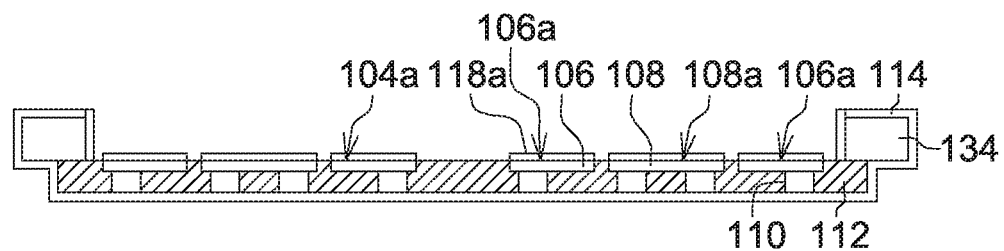

In step S116, referring to FIG. 2H, a first surface finishing 118a is formed on the exposed conductive trace layer 104. Preferably, the first surface finishing 118a is formed by electroplating on the entire trace surface 104a of the conductive trace layer 104 exposed in the cavity 116.

Alternatively, in other implementations, the first surface finishing 118a is formed on part of the trace surface 104a of the conductive trace layer 104 exposed in the cavity 116 after photolithography. Preferably, the first surface finishing 118a is only formed on the trace surface 106a of the trace 106, but not on the die pad surface 108a of the die pad 108. In addition, the first surface finishing 118a can further be formed on part of the trace surface 106a of the trace 106 only.

The first surface finishing 118a is formed by electrolytic plating and comprises of nickel (Ni), palladium (Pa) or gold (Au).

Specifically, in FIG. 2G, the plating conductive layer 114 electrically contacts the conductive stud 110, such that the conductive trace layer 104 is electrically connected to the plating ring 134 via the conductive stud 110 and the plating conductive layer 114. The plating ring 134 is subsequently connected to the electrode of the plating facility to allow electric current to flow through the plating conductive layer 114 for electroplating the first surface finishing 118a on the conductive trace layer 104. Furthermore, in FIG. 2H, every trace 106 and every die pad 108 of the conductive layer 104 are isolated from one another by the first dielectric layer 112 (two neighboring traces are also isolated from each other). However, the plating conductive layer 114 electrically connects all the trace 106 and die pad 108 together such that the first surface finishing 118a can be electroplated onto the conductive trace layer 104 simultaneously.

Figure 2I:
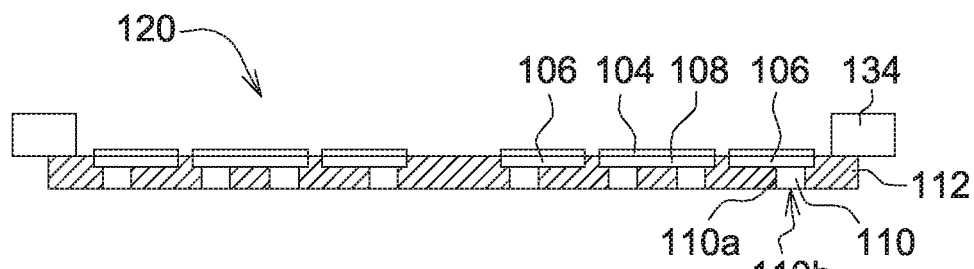

In step S118, referring to FIG. 2I, after forming the first surface finishing 118a, the plating conductive layer 114 is subsequently removed preferably by etching to re-expose the base surface 110b of the end 110a of the conductive stud 110 and the first dielectric surface 112a. After the plating conductive layer 114 is removed, every trace 106 and every die pad 108 of the conductive trace layer 104 are mutually isolated from one another and embedded in the first dielectric layer 112 respectively.

Figure 2J:
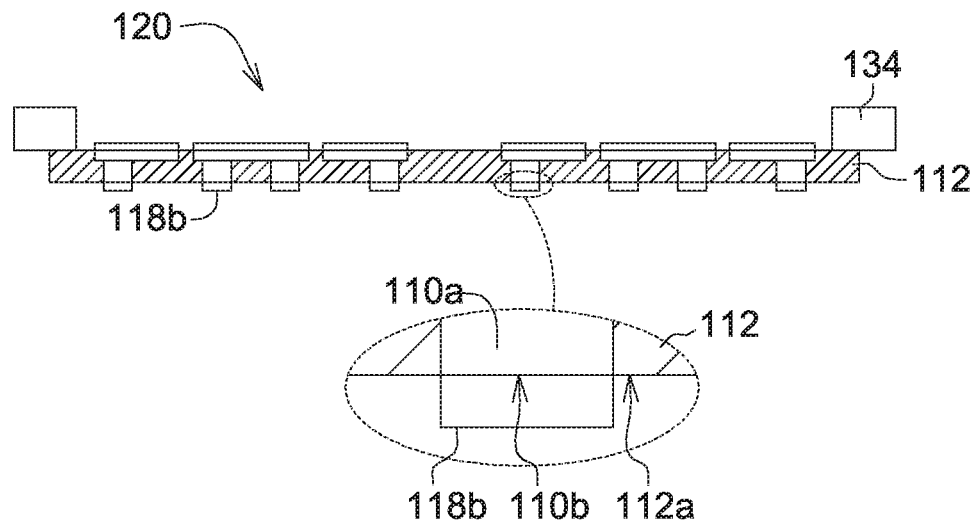

In step S120, referring to FIG. 2J, a second surface finishing 118b is thereafter formed on the exposed base surface 110b of the end 110a of the conductive stud 110 preferably by electroless plating. Thus, the formation of the semiconductor device carrier 120 of the present embodiment of the invention is completed.

Figure 4:
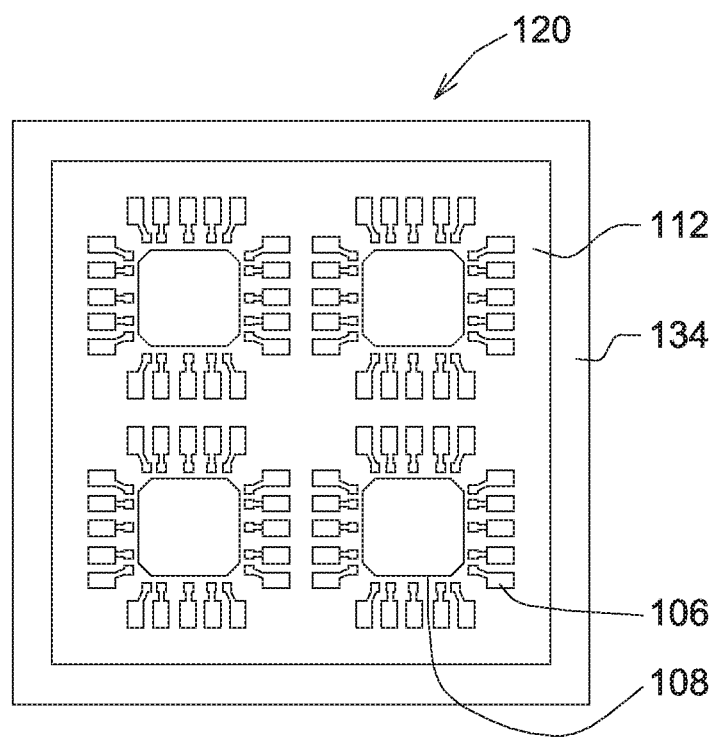
FIG. 4 shows a top view of the semiconductor device carrier of FIG. 2J.
Figure 5A:
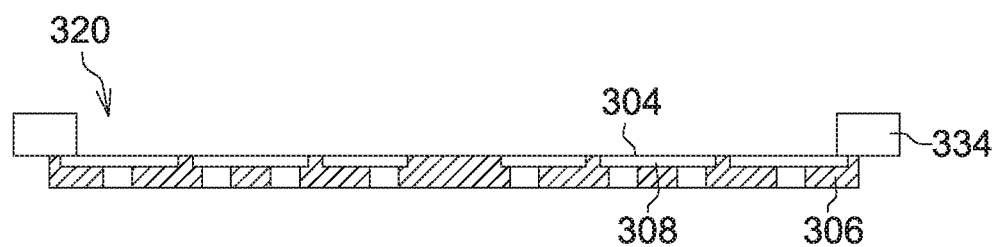
FIG. 5A shows a cross-sectional view of a semiconductor device carrier according to another embodiment of the invention.
Figure 5B:
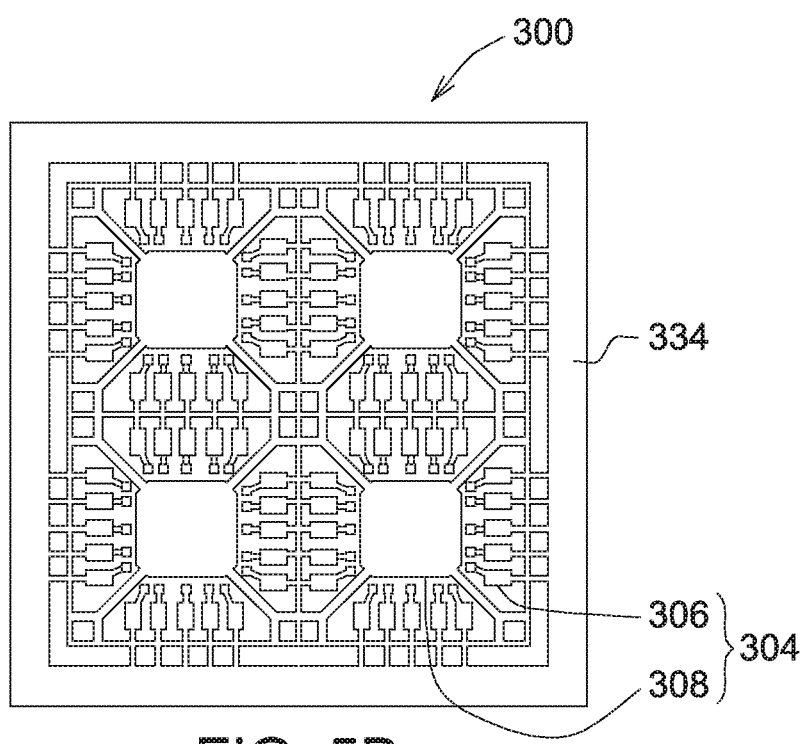
FIG. 5B shows a top view of the semiconductor device carrier of FIG. 5A.

Referring to FIG. 4, a top view of the semiconductor device carrier of FIG. 2J is shown. As shown in FIG. 4, the conductive trace layer 104 and the plating ring 134 are separated from each other by the first dielectric layer 112, but such exemplification does not limit the invention. Referring to FIGS. 5A~5B. FIG. 5A shows a cross-sectional view of a semiconductor device carrier according to another embodiment of the invention. FIG. 5B shows a top view of the semiconductor device carrier of FIG. 5A. The conductive trace layer 304 of the semiconductor device carrier 320 is electrically connected to the plating ring 334 of the semiconductor device carrier 320. Specifically, every trace 306 and every die pad 308 of the conductive trace layer 104 are interconnected and further connected electrically to the plating ring 334.

Referring to FIG. 2J, the plating conductive layer 114 is completely removed, but such exemplification does not limit the invention, and the invention is further elaborated below by other examples.

Figure 3A:
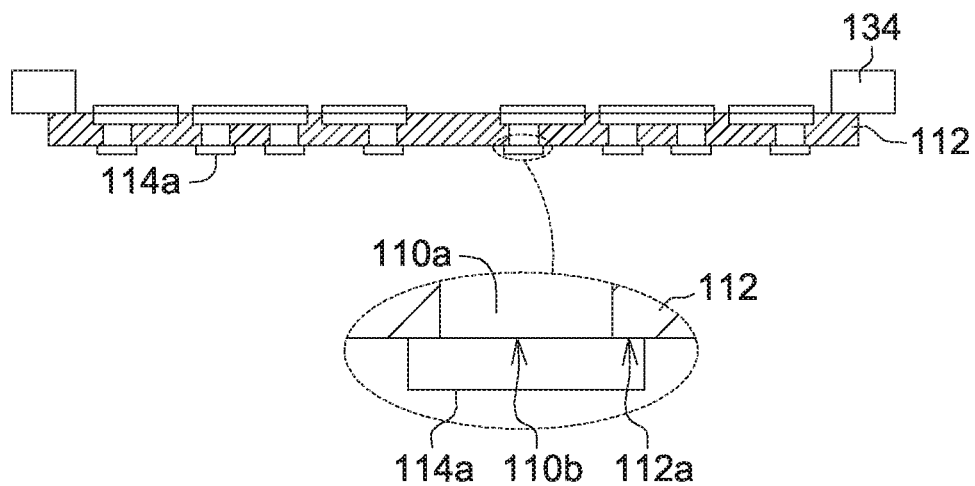
FIGS. 3A~3B shows the processes of manufacturing a semiconductor device carrier according to another embodiment of the invention.
Figure 3B:
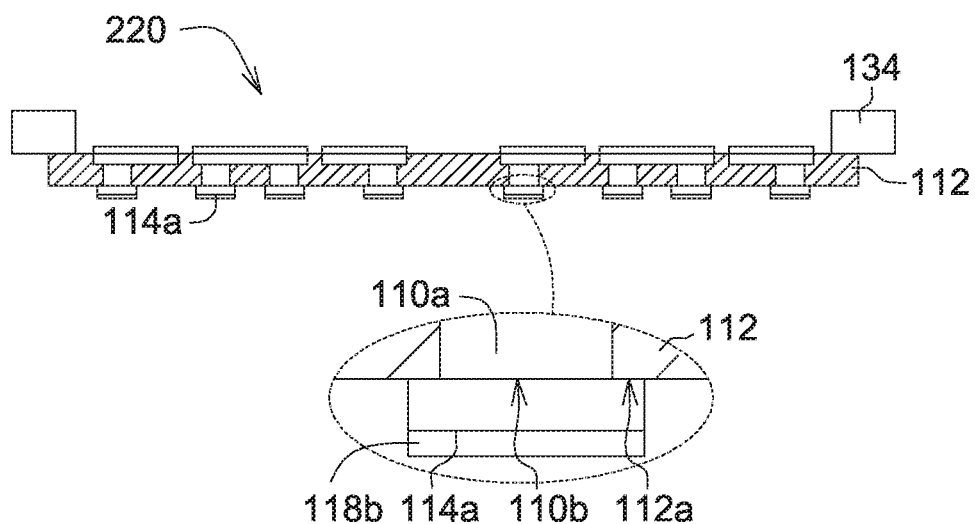

Referring to FIGS. 3A~3B, FIGS. 3A~3B illustrates the processes of manufacturing a semiconductor device carrier according to another embodiment of the invention are shown.

Referring to FIG. 3A, a portion of the plating conductive layer 114 is removed to form a remaining portion 114a, wherein the remaining portion 114a of the plating conductive layer 114 at least covers part of the conductive stud 110. In the present embodiment, the remaining portion 114a of the plating conductive layer 114 covers the entire base surface 110b of the conductive stud 110 and also extends onto a portion of the first dielectric surface 112a of the first dielectric layer 112. Consequently, the area of the remaining portion 114a of the plating conductive layer 114 is larger than that of the base surface 110b of the conductive stud 110. Using the remaining portion 114a as an enlarged electrical pad (bond pad) can help to improve the electrical and assembly quality. In another embodiment, the remaining portion 114a of the plating conductive layer 114 only covers the base surface 110b of the conductive stud 110 but not the first dielectric surface 112a.

Referring to FIG. 3B, a second surface finishing 118b is subsequently formed on the remaining portion 114a of the plating conductive layer 114 preferably by electroless plating.

Referring to FIG. 3A, alternatively the remaining portion 114a can also be considered as the second surface finishing 118b and formed simultaneously when the plating conductive layer 114 is removed. Thus the present embodiment of the invention does not require an additional manufacturing process for forming the second surface finishing 118b on the base surface 110b of the conductive stud 110. After a portion of the plating conductive layer 114 is removed, the second surface finishing 118b is also formed. Thus the formation of the semiconductor device carrier 220 is completed.

Figure 2K:
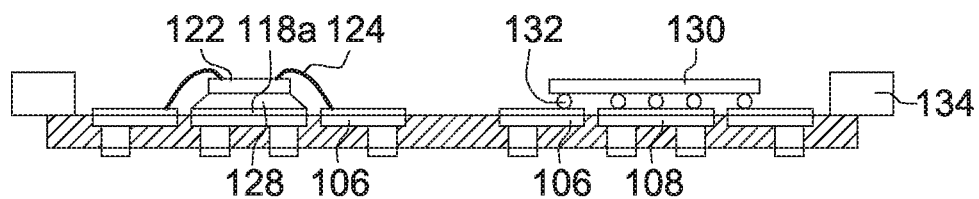
FIG. 2K~2M shows the processes of manufacturing a semiconductor package using the semiconductor device carrier.
Figure 2L:
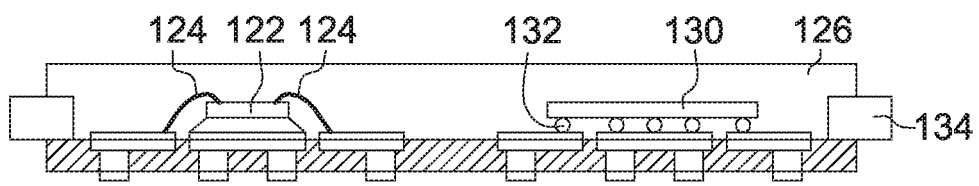
Figure 2M:
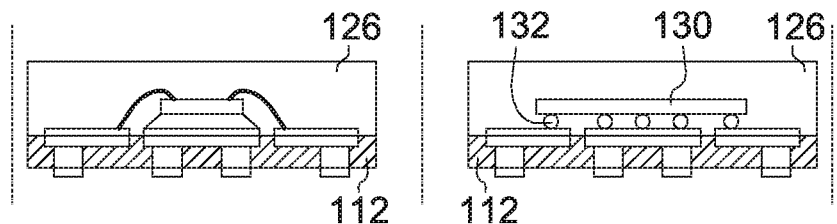

Referring to FIG. 2K to 2M, FIG. 2K to 2M illustrates the processes of manufacturing a semiconductor package using the semiconductor device carrier 220.

In step S122, referring to FIG. 2K, at least one semiconductor device 122 is disposed adjacent to the conductive trace layer 104. Preferably, the semiconductor device 122 has a rear surface 122b and an active surface 122a opposite to the rear surface 122b. In one instance, the rear surface 122b of the semiconductor device 122 may be attached to the conductive trace layer 104 by means of an adhesive 128. The face-up active surface 122a of the semiconductor device 122 is electrically connected to the trace 106 via at least one bonding wire 124 by connecting to the first surface finishing 118a of the trace 106. In another instance, the active surface of the semiconductor device 130 is in a face-down manner and several interconnections 132 are electrically connecting the semiconductor device 130 to at least one of the die pad 108 or the trace 106 via the first surface finishing 118a. In this case, the semiconductor device 130 is a flip-chip. In other implementation, in the absence of the first surface finishing 118a, the interconnections 132 of the semiconductor device 130 bond directly onto at least one of the die pad 108 or the trace 106.

In step S124, referring to FIG. 2L, a second dielectric layer 126 is formed by molding to encapsulate the semiconductor device 122 and the bonding wire 124.

In step S126, referring to FIG. 2M, the second dielectric layer 126 and the first dielectric layer 112 are singulated by using a cutting tool or laser to separate the assembled semiconductor device carrier 120. Thus the formation of the semiconductor package 100 is completed.

According to the manufacturing method for a semiconductor device carrier and the manufacturing method for a semiconductor package using the same disclosed in the above embodiments of the invention, the dielectric layer of the semiconductor device carrier encapsulates the conductive trace layer and the conductive stud layer which electrically connects the two opposite sides of the semiconductor device carrier. Since no through-hole is required and the dielectric layer has a smaller thickness, the size of the semiconductor package is thus effectively reduced. Furthermore, since the surface finishing on the mutually isolated traces and die pads of the conductive trace layer is formed by electrolytic plating, the stability and reliability of the product are further increased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package comprising:
   a dielectric layer having a first dielectric surface and a second dielectric surface opposite the first dielectric surface;
   a plurality of traces embedded in the dielectric layer and exposed on the second dielectric surface;
   a plurality of electrical pads disposed on the first dielectric surface;
   a plurality of studs embedded in the dielectric layer and electrically connected to the plurality of traces and the plurality of electrical pads;
   at least a semiconductor device disposed on the second dielectric surface and electrically connected to the plurality of traces; and
   a conductive carrier disposed on the second dielectric surface and having at least one cavity, wherein the cavity exposes a portion of the second dielectric surface and the plurality of traces is electrically connected to the conductive carrier.

2. The semiconductor package according to claim 1, wherein the semiconductor device having a rear surface and an active surface opposite the rear surface, the semiconductor device is disposed in a face-up manner wherein the rear surface is attached to the second dielectric surface by means of an adhesive, the active surface faces away from the second dielectric surface and electrically connected to the plurality of traces via bonding wires.

3. The semiconductor package according to claim 1, wherein the semiconductor device having a rear surface and an active surface opposite the rear surface, the semiconductor device is disposed in a face-down manner wherein the active surface faces towards the second dielectric surface and electrically connected to the plurality of traces via interconnections.

4. The semiconductor package according to claim 1, further comprising a second dielectric layer encapsulating the semiconductor device.

5. The semiconductor package according to claim 1, wherein the semiconductor device is disposed within the cavity of the conductive carrier.

6. The semiconductor package according to claim 1, wherein the conductive carrier is a metal plate comprises iron or copper.

7. The semiconductor package according to claim 1, wherein the dielectric layer comprises a resin material.

8. The semiconductor package according to claim 7, wherein the dielectric layer further comprises a filler material.

9. The semiconductor package according to claim 8, wherein the resin material is epoxy-based and the filler material is powdered silicon dioxide.

10. The semiconductor package according to claim 1, wherein each of the plurality of studs having a base surface exposed and substantially aligned with the first dielectric surface.

11. The semiconductor package according to claim 10, wherein the plurality of electrical pads is disposed on the base surfaces and electrically connected to the plurality of studs.

12. The semiconductor package according to claim 11, wherein the electrical pad covers the base surface of the stud.

13. The semiconductor package according to claim 12, wherein in a plan view of the dielectric layer, the area of the electrical pad is larger than the area of the base surface of the stud.

* * * * *